United States Patent
Ivanov

(10) Patent No.: US 8,506,882 B2
(45) Date of Patent: Aug. 13, 2013

(54) HIGH PURITY TARGET MANUFACTURING METHODS

(75) Inventor: Eugene Y. Ivanov, Grove City, OH (US)

(73) Assignee: Tosoh SMD, Inc., Grove City, OH (US)

( * ) Notice: Subject to any disclaimer, the term of this patent is extended or adjusted under 35 U.S.C. 154(b) by 674 days.

(21) Appl. No.: 12/387,134

(22) Filed: Apr. 28, 2009

(65) Prior Publication Data

US 2009/0214374 A1 Aug. 27, 2009

Related U.S. Application Data

(63) Continuation of application No. 11/587,449, filed as application No. PCT/US2005/019195 on Jun. 1, 2005, now abandoned.

(60) Provisional application No. 60/579,748, filed on Jun. 15, 2004.

(51) Int. Cl.
*B22F 3/02* (2006.01)
*B22F 3/18* (2006.01)

(52) U.S. Cl.
USPC .................................. 419/68; 419/66; 419/69

(58) Field of Classification Search
USPC .................. 75/228, 245–250, 746–773, 950; 148/407, 423; 420/430
See application file for complete search history.

(56) References Cited

U.S. PATENT DOCUMENTS

| 4,126,451 A * | 11/1978 | Nayar ............................ 419/8 |
| 6,283,357 B1 * | 9/2001 | Kulkarni et al. ............... 228/155 |
| 2002/0041819 A1 * | 4/2002 | Kumar et al. .................. 419/66 |
| 2005/0029094 A1 * | 2/2005 | Watanabe et al. ......... 204/298.13 |

FOREIGN PATENT DOCUMENTS

| JP | 03-150356 | * | 6/1991 |
| JP | 05-222525 | * | 8/1993 |
| JP | 10-183341 | * | 7/1998 |

* cited by examiner

*Primary Examiner* — Scott Kastler
*Assistant Examiner* — Vanessa Luk
(74) *Attorney, Agent, or Firm* — Wegman, Hessler & Vanderburg

(57) ABSTRACT

A method for producing a high purity tungsten sputtering target. The method includes heat treating of high purity tungsten powder in order to consolidate it into a blank with density providing closed porosity. The consolidation may be achieved by hot pressing, HIP or any other appropriate method. Next, this plate is rolled to produce target blanks of approximate size and further increased density of the material. The method may be applicable to a variety of blanks including round shape target blanks, for example, consisting of tungsten, molybdenum, tantalum, hafnium, etc.

4 Claims, No Drawings

HIGH PURITY TARGET MANUFACTURING METHODS

CROSS REFERENCE TO RELATED APPLICATIONS

This application is a continuation of U.S. National Phase patent application Ser. No. 11/587,449 filed on Oct. 24, 2006, which, in turn, is the U.S. National Phase Application of International Patent Application No. PCT/US2005/019195 filed on Jun. 1, 2005, which, in turn, claims priority benefit of U.S. Provisional Application Ser. No. 60/579,748 filed on Jun. 15, 2004.

FIELD OF THE INVENTION

The present invention pertains to methods for making high purity sputter targets of Group IV, V, and/or VI metals and alloys thereof for use in physical vapor deposition of thin films.

BACKGROUND OF THE INVENTION

Sputter targets are used in physical vapor deposition (PVD) techniques in order to provide thin films on complex integrated circuits. In these processes, it is important that the sputter target provide film uniformity and minimal particle generation. Electrical resistivity of the coated thin film must also be acceptable.

In many prior art techniques for making sputter targets, target densities are low with concomitant increased porosity serving as a possible contaminant site. In order to obtain suitable high density and low porosity, high temperature manufacturing processes are employed that, in turn, sometimes lead to undesirable grain growth in the target.

Often high oxygen content targets result from the conventional processes. Films coated by such targets exhibit undesirable electric resistivity. Thus, many of the prior art sputter target manufacturing methods result in unacceptable target and resulting film characteristics such as contamination, low density, and undesirable electrical properties.

SUMMARY OF THE INVENTION

A method of preparing a metal or metal alloy sputter target in accordance with one aspect of the invention, comprises providing a metal or metal alloy powder particles wherein the metal is a member of the Groups IV, V or VI of the periodic chart. The powder has a purity of at least 5 Ns. The powder is pressure consolidated, preferably under heated conditions, to form a blank having a density of greater than about 95% of the theoretical density. The density of the blank is then increased to at least about 99% density, preferably via a thermomechanical rolling step. The increased density blank is then formed into the shape required for a sputter target.

In another aspect of the invention, a tungsten or tungsten alloy sputter target is provided. Here, tungsten or tungsten alloy powder particles having a particle size of less than 100 um, preferably less than 50 um. Then, the particles are pressured consolidated to form a plate material having a density of greater than about 95% of the theoretical density. The thus formed plate is thermo mechanically rolled so that it will have a density of at least about 97.5% of the theoretical density. The plate is then formed into the desired target shape.

DETAILED DESCRIPTION OF EXEMPLARY EMBODIMENTS

Improved sputter target manufacturing processes and sputter targets thereby produced are disclosed herein. Generally, the invention is applicable to any sputtering metal or alloy thereof of Groups IV, V, and VI of the periodic chart. More specifically, W, Ta, Mo, and Hf targets and alloys thereof can be prepared in accordance with the invention.

Although the invention will be specifically described with regard to W and W alloy targets, it is to be remembered that other metals and alloys as above noted may also be employed and are, unless noted to the contrary in the claims, within the purview of the invention.

Initially, a Group IV, V, or VI metal powder, typically W or W alloy, is provided. The purity of the powder may be 5N or greater.

The powder is then pressure consolidated to form a blank having a density of greater than 95% of the theoretical density. In one aspect of the invention, the powder is pressure consolidated in the presence of heat. More preferably, the blank will have a density of 99% or greater and will be in a substantially closed pore condition after the pressure consolidation. Exemplary pressure consolidation operations include both the hot press and the hot isostatic pressing processes. In the hot press operation, the pressure consolidation is carried out, for example, preferably under vacuum conditions of about $10^{-3}$ to $10^{-6}$ torr at temperatures of about 1400° C. to 2000° C. The press pressure is typically about 25 to 500 kg/cm$^2$ and hot pressing is conducted for about 30 minutes to about 10 hours. The resulting blank material should have a density of at least about 95% of the theoretical density, preferably about 97.5% and greater, most preferably 99.0% and greater.

Another exemplary pressure consolidation technique is hot isostatic pressing (HIP). Here, the powder is subjected to a temperature of about 1000° C.-1900° C. for a period of about 1 to 10 hours at pressures of about 15 ksi and greater. Again, the resulting density of the W or W alloy should be greater than 95%, preferably about 97.5% and greater, most preferably 99.0% and greater.

The pressure consolidated blank is then thermomechanically rolled at temperatures of about 1400° C.-1700° C. to result in a density increase to at least 99.5%, preferably 100% and to effect a size (thickness) reduction of about 40% or greater, preferably 50% or greater.

The thermomechanically rolled blank can then be formed into the requisite shape for sputter target usage by conventional machining techniques such as electro-discharge machining, water jet cutting or use of a conventional mechanical lathe. Once machined, the sputter target can be bonded to a backing plate using known methods such as soldering, diffusion bonding, friction welding, e-beam welding, and low temperature mechanical interlocking techniques.

Targets made by the above methods are characterized by the following parameters:
target purity—at least 5N;
target grain size—average grain size of 100 um or less;
oxygen content—less than 100 ppm.

The invention will now be described in conjunction with the following examples which are to be regarded as being illustrative of the invention and should not be used to limit or narrowly construe the claims.

EXAMPLES

Example 1

High purity blank is produced by hot pressing of W powder. The blank size is 14 inches diameter×0.75 inches thick and has an approximate density of 98%. The blank is then hot rolled at 1500° C. to result in a blank of 19 inches diameter× 0.36 inches with a density of about 100%. The hot rolled blank is suitable to produce a target blank for 300 mm applications. The purity of the rolled blank is 5N, and the blank does not show any contamination caused by the rolling process.

Example 2

A rolled blank made by the method of Example 1 was measured to ascertain its density in accord with the Archimedean principle. The density of the blank measured by this method was 99.7%. Several lots of W plates obtained from commercial suppliers were measured for density by the same method and were found rarely to correspond to 100% of the theoretical density.

Densities of the measured W plates were as follows:

|  | Density |
| --- | --- |
| Lot 192 commercial supplier | 99.67 |
| Lot 192 commercial supplier | 99.90 |
| Lot 219 commercial supplier | 98.99 |
| Lot 104 commercial supplier | 99.74 |
| *Example 1 blank | 99.33 |
| *Example 1 blank | 100.00 |
| *Example 1 blank | 99.51 |
| *Example 1 blank | 99.51 |
| Lot 105 | 99.30 |
| Lot 105 | 100.00 |
| Lot 108 | 99.16 |

*Hot rolled as set forth in Example 1.

Example 3

Comparative

An attempt was made to use 5 NW powder in a conventional sintering rolling process. The sintered body was no more than 85% dense. Rolled plates in this comparative process resulted in contamination and the purity decreased to only 4N with total metallic impurities being in the range of about 100 ppm.

Example 4

In contrast to the metallic impurity levels noted in comparative Example 3, total metallic impurities for two samples made in accordance with the hot rolling techniques of Example 1 ranged from about 3.87 ppm to 11.59 ppm as indicated in the following table.

|  | Example 1 Lot 1 | Example 1 Lot 2 |
| --- | --- | --- |
| Si Trace | 0.078 | 0.26 |
| Al Trace | 0.30 | 0.13 |
| Mo Trace | 0.034 | 0.02 |
| V Trace | 0.023 | 0.022 |
| Cr Trace | 0.26 | 0.19 |
| Ti Trace | 0.049 | 0.026 |
| Ca Trace | 0.24 | 0.19 |
| Cu Trace | 5.24 | 0.70 |
| Mg Trace | 0.01 | 0.011 |
| Mn Trace | 0.19 | 0.20 |
| Fe Trace | 0.48 | 0.33 |
| Co Trace | 0.042 | 0.024 |

-continued

|  | Example 1 Lot 1 | Example 1 Lot 2 |
| --- | --- | --- |
| Ni Trace | 0.15 | 0.085 |
| Na Trace | 0.89 | 0.45 |
| K Trace | 0.039 | 0.045 |
| Li Trace | <0.002 | 0.002 |
| Ag Trace | <0.003 | <0.003 |
| Au Trace | 1.67 | <0.008 |
| Sb Trace | <0.003 | <0.003 |
| Pb Trace | <0.02 | <0.02 |
| Be Trace | <0.002 | <0.002 |
| B Trace | 0.023 | 0.006 |
| F Trace | 0.035 | <0.03 |
| P Trace | 0.025 | 0.027 |
| Cl Trace | 0.01 | 0.004 |
| Sc Trace | <0.002 | <0.002 |
| Zn Trace | 0.65 | <0.02 |
| Ga Trace | <0.005 | <0.005 |
| Ge Trace | 0.031 | <0.02 |
| As Trace | <0.002 | <0.002 |
| Se Trace | <0.02 | <0.02 |
| Br Trace | <0.05 | <0.05 |
| Rb Trace | <0.002 | <0.002 |
| Sr Trace | <0.002 | 0.004 |
| Y Trace | <0.002 | <0.002 |
| Zr Trace | 0.015 | <0.007 |
| Nb Trace | <0.02 | <0.02 |
| Ru Trace | <0.007 | <0.007 |
| Rh Trace | 0.005 | 0.002 |
| Pd Trace | <0.007 | <0.007 |
| Cd Trace | <0.007 | <0.007 |
| In Trace | <0.002 | <0.002 |
| Sn Trace | <0.03 | <0.03 |
| Te Trace | <0.005 | <0.005 |
| I Trace | <0.003 | <0.003 |
| Cs Trace | 0.078 | <0.002 |
| Ba Trace | 0.011 | 0.012 |
| La Trace | <0.002 | <0.002 |
| Ce Trace | <0.002 | <0.002 |
| Pr Trace | <0.002 | <0.002 |
| Nd Trace | <0.007 | <0.007 |
| Sm Trace | <0.01 | <0.01 |
| Eu Trace | 0.12 | 0.25 |
| Gd Trace | <0.007 | <0.007 |
| Tb Trace | <0.002 | <0.002 |
| Dy Trace | <0.006 | <0.006 |
| Ho Trace | <0.002 | <0.002 |
| Er Trace | <0.005 | <0.005 |
| Tm Trace | <0.002 | <0.002 |
| Yb Trace | <0.006 | <0.006 |
| Lu Trace | <0.002 | <0.002 |
| Hf Trace | <0.04 | <0.04 |
| Re Trace | <0.30 | <0.30 |
| Os Trace | <0.005 | <0.005 |
| Ir Trace | <0.003 | 0.003 |
| Pt Trace | <0.20 | <0.20 |
| Hg Trace | 0.096 | <0.02 |
| Tl Trace | <0.002 | <0.002 |
| Bi Trace | <0.002 | <0.002 |
| Th Trace | 0.0009 | <0.0005 |
| U Trace | <0.0005 | <0.0005 |
| Impurity Total ppm | 11.5984 | 3.897 |

Example 5

Comparative

In order to demonstrate the importance of the hot rolling step in increasing density of the blank, samples produced without use of this step were made and assessed for density.

Example 5A

W powder with 5N purity was hot pressed at 1800° C., 250 kg/cm$^2$ for 2 hours. The density of the so formed blank was 97.5% and this blank was then HIPed at 30,000 psi, T=1450° C. for 4 hours in an attempt to increase density. After the HIPing step, the density was measured using OIA (optical imaging analysis). In contrast to immersion density measurement methods, this method allows one to observe changes in porosity levels. The following table (5A) shows the porosity level of the blank both before and after HIPing.

TABLE 5A

Porosity (No Hot Rolling)

|  | Before HIP | After HIP |
|---|---|---|
| Porosity % | | |
| Min | 1.711 | 2.565 |
| Max | 3.832 | 2.774 |
| Mean | 3.036 | 1.394 |
| STD | 0.530 | 0.634 |
| Porosity μ | | |
| Min | 0.328 | 0.38 |
| Max | 9.622 | 7.293 |
| Mean | 2.229 | 1.394 |
| STD | 1.026 | 0.634 |

This comparative Example (5A) shows that the HIP method cannot be used to increase the density of the relatively dense W plate formed via hot pressing of the precursor W particles. Apparently, shear deformation, such as is provided by rolling, is required in order to increase the density and close the porosity of the plate.

Example 5B

W powder with 5N purity was hot pressed at 1800° C. with a pressure of 250 kg/cm² for 2 hours. This resulted in formation of a blank having 97.5% density. Blanks so formed were sintered at 2,000° C. for 2 hours to see if this would result in increase in density. After sintering, the density was measured using OIA.

Table 5B shows the resulting measurements.

TABLE 5B

|  | Before sintering | After sintering |
|---|---|---|
| Porosity % | | |
| Min | 1.007 | 2.871 |
| Max | 2.102 | 3.490 |
| Mean | 1.655 | 3.187 |
| STD | 0.300 | 0.182 |
| Porosity, μ | | |
| Min | 0.768 | 0.768 |
| Max | 8.305 | 9.025 |
| Mean | 2.394 | 2.469 |
| STD | 0.828 | 0.87 |

Comparative Example 5B shows that use of a high temperature sintering step after a hot pressing step did not increase the density of the hot pressed blank.

Example 6

Purity of the W targets is one important target characteristic. In order to show the importance of a hot pressure consolidation step such as a hot press step as used in the invention to provide the necessary pressure consolidation of the W powder, comparative samples were made by a cold isostatic pressing (CIP) of the W powder followed by sintering of the CIPed mass. The sintered mass was then rolled to about 94.1% density. Purity levels of these samples were compared to the powder precursor that is used in the methods disclosed herein, to prepare samples under the procedures set forth in Example 1. Results are shown in Table 6.

TABLE 6

| Element | Powder | Comp. A | Comp. B |
|---|---|---|---|
| Al | 0.43 | 5.8 | 4.5 |
| Si | 0.54 | 1.8 | 0.87 |
| Na + K | 0.068 | 0.102 | 0.141 |
| Ti | 0.04 | 0.32 | 0.8 |
| Cr | 0.14 | 0.85 | 1.6 |
| Mn | 0.12 | 0.004 | <0.005 |
| Fe | 0.21 | 2.1 | 2.2 |
| Co | 0.003 | 0.028 | 0.03 |
| Ni | 0.12 | 0.82 | 0.96 |
| Zn | 0.017 | <0.01 | <0.01 |
| Zr | 0.05 | 4.8 | 4.2 |
| Mo | 0.1 | 3.9 | 0.2 |

Comp A and Comp B = CIP and sintering method described above in this example.

Note that in this example, an increase was noted in the impurity content of many of the elements when the CIP/sintering method was used. (Also, standard production equipment was used—not high purity dedicated equipment). Some of the impurities actually decreased due to evaporation at high sintering temperatures (i.e., see Mn and Zn).

Various modifications may be made in the present invention without departing from the spirit of the invention or the scope of the appended claims.

What is claimed is:

1. Method of preparing a W sputter target comprising:
   a) providing a powder consisting essentially of W particles having a particle size of less than about 100 microns and a purity of at least 5Ns;
   b) hot isostatically pressing said particles at heated temperature conditions of from about 1,000° C. to 2,000° C. to form a plate having a density of greater than about 95% of the theoretical density; and
   c) thermomechanically rolling the plate material so that it has a density of above about 97.5% of the theoretical density by hot rolling said plate at a temperature of about 1400° C. to 1700° C. resulting in a thickness reduction of greater than about 40%.

2. Method as recited in claim 1 wherein said thermo-mechanical rolling of the plate material results in a density of about 99% and greater.

3. Method as recited in claim 2 wherein said thermo-mechanical rolling of said plate material results in a density of about 100%.

4. Method as recited in claim 3 wherein said step of hot isostatically pressing said particles is conducted at a temperature of about 1,000° C. to about 1,900° C. for about 1 to 10 hours at a pressure of about 15 Ksi and greater.

* * * * *